United States Patent [19]
Kim et al.

[11] Patent Number: 5,814,148
[45] Date of Patent: Sep. 29, 1998

[54] METHOD FOR PREPARING MOLTEN SILICON MELT FROM POLYCRYSTALLINE SILICON CHARGE

[75] Inventors: Kyong-Min Kim, St. Charles; Leon A. Allen, Grover, both of Mo.

[73] Assignee: MEMC Electronic Materials, Inc., St. Peters, Mo.

[21] Appl. No.: 595,075

[22] Filed: Feb. 1, 1996

[51] Int. Cl.⁶ ................................................. C30B 15/14
[52] U.S. Cl. ........................... 117/13; 117/17; 117/35; 117/932
[58] Field of Search ................ 117/35, 932, 13, 117/17

[56] References Cited

U.S. PATENT DOCUMENTS

| | | | |
|---|---|---|---|
| 4,249,988 | 2/1981 | Lavigna et al. | 117/932 |
| 5,340,434 | 8/1994 | Takano et al. | 117/932 |
| 5,415,125 | 5/1995 | Fujita et al. | 117/932 |
| 5,588,993 | 12/1996 | Holder et al. | 117/13 |

FOREIGN PATENT DOCUMENTS

| | | | |
|---|---|---|---|
| 03-193694 | 8/1991 | Japan | 117/35 |
| 05-270969 | 10/1993 | Japan | 117/932 |
| 86/06764 | 11/1986 | WIPO | 117/932 |

*Primary Examiner*—Robert Kunemund
*Attorney, Agent, or Firm*—Senniger, Powers, Leavitt & Roedel

[57] ABSTRACT

A process for preparing a molten silicon melt from polycrystalline silicon for use in producing single crystal silicon by the Czochralski method is disclosed. Granular and chunk polycrystalline silicon are loaded into a Czochralski crucible as a mixed charge. Preferably, the granular polycrystalline silicon is loaded onto the bottom, mounded toward the centerline of the crucible, and not contacting the upper portion of the wall of the crucible. The chunk polycrystalline silicon is loaded onto the granular polycrystalline silicon. The granular polycrystalline silicon and chunk polycrystalline silicon are melted to form a silicon melt, preferably by heating the polycrystalline silicon from the bottom up such that a substantial portion of the granular polycrystalline silicon is melted before a substantial portion of the chunk polycrystalline silicon is melted. As the melting progresses, the chunk polycrystalline silicon exerts a downward force on the granular polycrystalline silicon to keep the latter in the relatively hotter bottom region of the crucible. If the polycrystalline silicon is exposed to a purge gas, the chunk polycrystalline silicon thermally shields the granular polycrystalline silicon from the cooling effects of the purge gas.

34 Claims, 3 Drawing Sheets

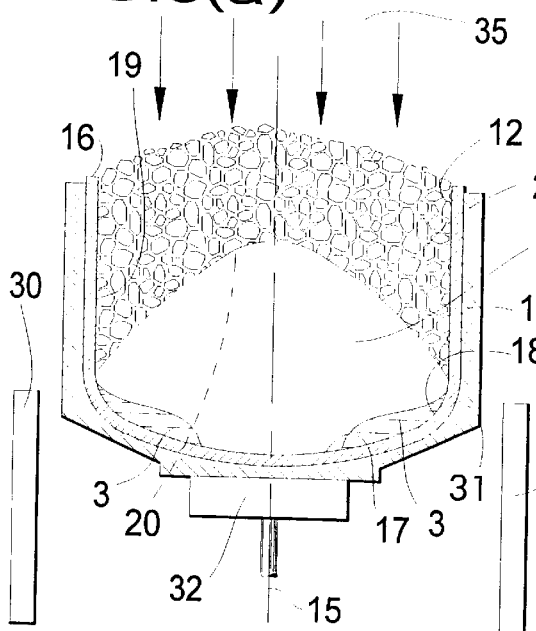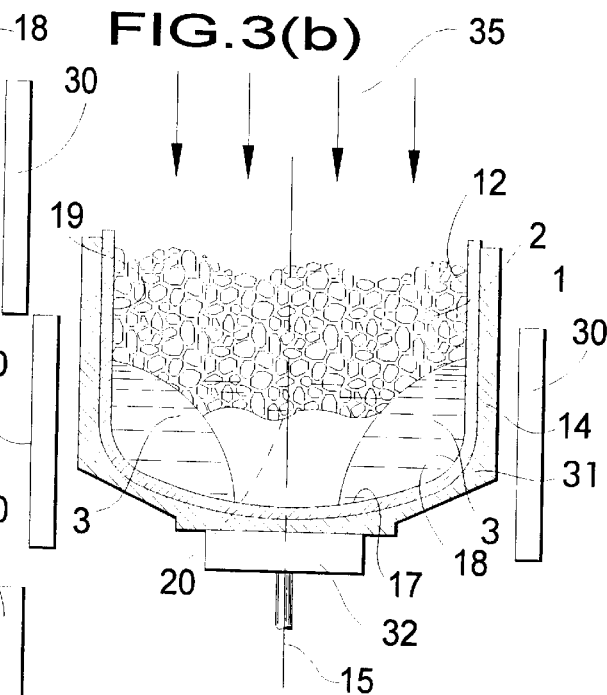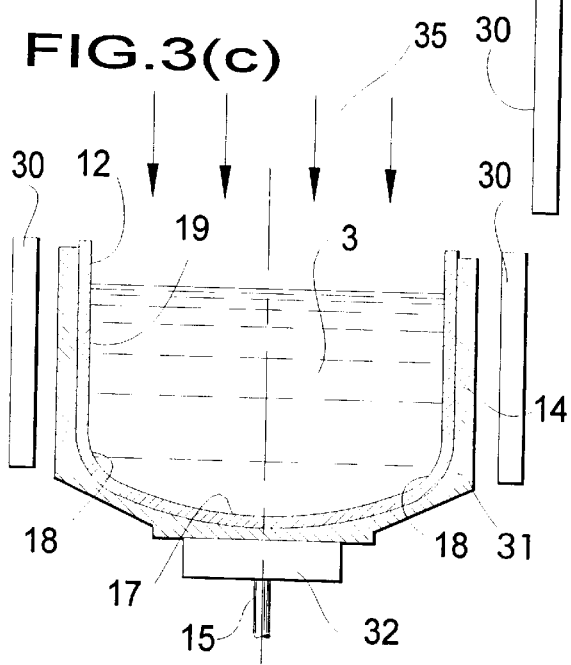

5,814,148

METHOD FOR PREPARING MOLTEN SILICON MELT FROM POLYCRYSTALLINE SILICON CHARGE

BACKGROUND OF THE INVENTION

The present invention generally relates to the production of single crystal silicon, and specifically, to a process for preparing a molten silicon melt from polycrystalline silicon. The invention particularly relates, in a preferred embodiment, to a process for preparing a molten silicon melt from a mixed charge of chunk and granular polycrystalline silicon.

Most single crystal silicon used for microelectronic circuit fabrication is prepared by the Czochralski (CZ) process. In this process, a single crystal silicon ingot is produced by melting polycrystalline silicon in a crucible, dipping a seed crystal into the molten silicon, withdrawing the seed crystal in a manner sufficient to achieve the diameter desired for the ingot and growing the single crystal at that diameter.

The polycrystalline silicon melted to form the molten silicon is typically irregularly shaped chunk polycrystalline silicon prepared by the Siemens process or, alternatively, free-flowing, generally spherically-shaped granular polycrystalline silicon, typically prepared by a relatively simpler and more efficient fluidized-bed reaction process. Granular polycrystalline silicon is typically about 1–5 mm in diameter, and generally has a packing density which is about 20% higher than chunk polycrystalline silicon. The preparation and characteristics of chunk and granular polycrystalline silicon are further detailed in F. Shimura, *Semiconductor Silicon Crystal Technology*, pages 116–121, Academic Press (San Diego Calif., 1989) and the references cited therein.

CZ crucibles are typically initially charged entirely with chunk polycrystalline silicon. However, such loadings cause problems in the subsequent manufacture of the silicon crystal ingot. For example, the edges of the chunks under the load of a full charge can scratch and gouge the crucible wall, particularly at the bottom of the crucible, resulting in a damaged crucible and in particles of crucible floating on or being suspended in the silicon melt. These impurities significantly increase the likelihood of dislocations forming within the single crystal, and decrease the dislocation-free single crystal production yields and throughput. Moreover, as melting proceeds, the chunk polycrystalline silicon charge can shift or the lower portion of the chunk-polycrystalline silicon can melt away and leave either a "hanger" of unmelted material stuck to the crucible wall above the melt or a "bridge" of unmelted material bridging between opposing sides of the crucible wall over the melt. When the charge shifts or a hanger or bridge collapses, it may splatter molten silicon and/or cause mechanical stress damage to the crucible. Additionally, initial loadings of 100% chunk-polycrystalline silicon limits the volume of material which can be charged due to the poor packing densities of such chunk materials. The volume limitations directly impact single crystal throughput.

Although granular polycrystalline silicon offers advantages over chunk polycrystalline silicon with respect to preparation and packing density, the full capacity charging of granular polycrystalline silicon into the crucible and the melting thereof can also introduce undesirable impurities and defects into the single crystal silicon ingot. As such, granular polycrystalline silicon has primarily been used for the supplemental recharging of an existing silicon melt, as exemplified in U.S. Pat. Nos. 5,242,531 and 5,242,667 to Klingshirn et al. and Koziol et al., respectively.

SUMMARY OF THE INVENTION

It is therefore an object of the present invention to prepare a molten silicon melt suitable for producing single crystal silicon ingots with improved zero dislocation growth and throughput, by decreasing the mechanical and thermal stresses on the crucible and maximizing the volume of polycrystalline silicon in the initial loading. It is also an object of the invention to prepare a molten silicon melt suitable for producing single crystal silicon ingots with improved zero dislocation growth and throughput without adding significant additional process costs, equipment or time.

Briefly, therefore, the present invention is directed to a process for preparing a molten silicon melt from polycrystalline silicon for use in producing single crystal silicon by the Czochralski method. The process comprises loading granular polycrystalline and chunk polycrystalline silicon into a crucible with the chunk polycrystalline silicon being loaded onto the granular polycrystalline silicon. The granular polycrystalline silicon and the chunk polycrystalline silicon are then melted to form a silicon melt.

A molten silicon melt may also be prepared by a process which comprises loading granular polycrystalline silicon and chunk polycrystalline silicon into a crucible having an inner surface which includes a wall. The wall has an upper portion which includes about 50% of the surface area of the wall. The granular polycrystalline silicon is loaded such that, after loading, the granular polycrystalline silicon does not contact the upper portion of the wall. The granular polycrystalline silicon and the chunk polycrystalline silicon are then melted to form a silicon melt.

An additional process for preparing a molten silicon melt comprises loading granular polycrystalline silicon and chunk polycrystalline silicon into a crucible and melting the granular and chunk polycrystalline silicon to form a silicon melt. A substantial portion of the granular polycrystalline silicon is melted before a substantial portion of the chunk polycrystalline silicon is melted.

A further process for preparing a molten silicon melt comprises loading granular polycrystalline silicon and chunk polycrystalline silicon into a crucible, and exposing the granular and chunk polycrystalline silicon to a purge gas. The chunk polycrystalline silicon thermally shields the granular polycrystalline silicon from cooling effects of the purge gas. The granular and chunk polycrystalline silicon are melted to form a silicon melt.

In another process for preparing a molten silicon melt, granular polycrystalline silicon and chunk polycrystalline silicon are loaded into a crucible having a centerline and an inner surface which includes a bottom and a wall. The wall has an upper portion which includes about 50% of the surface area of the wall. The granular polycrystalline silicon is loaded onto the bottom, and, after loading, the granular polycrystalline silicon does not contact the upper portion of the wall. Moreover, the height of the granular polycrystalline silicon at or near the centerline of the crucible is greater than its height at or near the wall. The chunk polycrystalline silicon is loaded onto the granular polycrystalline silicon. The polycrystalline silicon is heated and a substantial portion of the granular polycrystalline silicon is melted before a substantial portion of the chunk polycrystalline silicon is melted. While heating, the granular and chunk polycrystalline silicon are exposed to a purge gas and the chunk polycrystalline silicon thermally shields the granular polycrystalline silicon from cooling effects of the purge gas. Any unmelted granular polycrystalline silicon and chunk polycrystalline silicon are melted to form a silicon melt.

In another embodiment of the process for preparing a silicon melt, an amount of granular polycrystalline silicon is loaded into a crucible having a centerline, a maximum weight capacity based on a pure granular polycrystalline silicon loading, and an inner surface which includes a wall. The wall has an upper portion which includes about 50% of the surface area of the wall. The amount of the granular polycrystalline silicon loaded is less than about 65% by weight of the maximum capacity of the crucible. The granular polycrystalline silicon is loaded such that, after loading, the granular polycrystalline silicon does not contact the upper portion of the wall, and such that the height of the granular polycrystalline silicon at the centerline of the crucible is greater than its height at the wall. The granular polycrystalline silicon is then melted to form a silicon melt entirely from granular polycrystalline silicon.

Other features and objects of the present invention will be in part apparent to those skilled in the art and in part pointed out hereinafter.

BRIEF DESCRIPTION OF THE DRAWINGS

FIGS. 3(a) through 3(c) are section views showing various stages of melting an initial mixed charge of granular and chunk polycrystalline silicon.

DETAILED DESCRIPTION OF THE INVENTION

Figure 1:
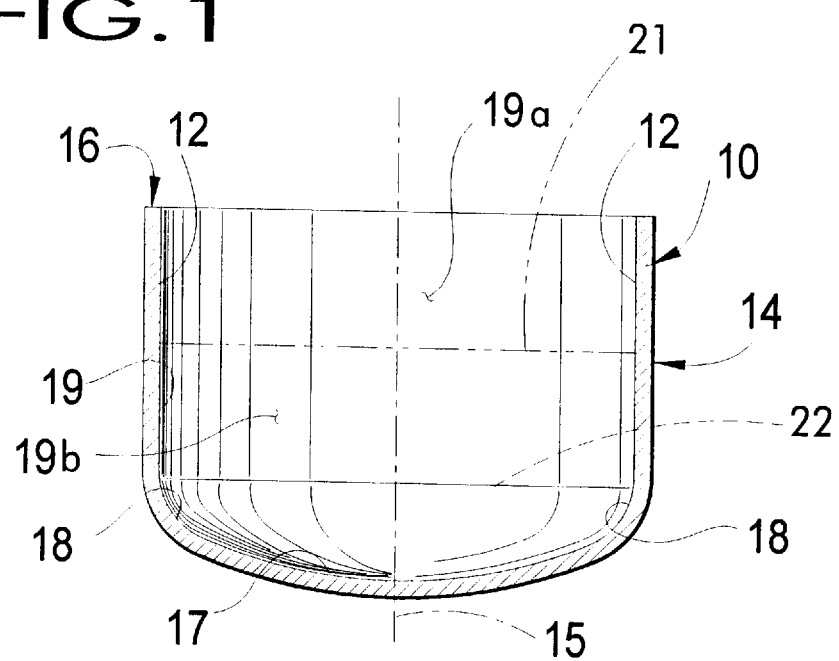
FIG. 1 is a section view of an empty Czochralski crucible.

In the present invention, granular polycrystalline silicon is loaded into a Czochralski crucible, preferably with chunk polycrystalline silicon as a mixed charge, and arranged in a manner which minimizes sintering or fusion of granules of polycrystalline silicon to other granules or to the crucible wall during subsequent melting. Such sintering or fusion problems occur when silicon melts are prepared from a crucible packed to its maximum capacity entirely with granular polycrystalline silicon. Aggregates formed by granule-to-granule sintering have mirrored surfaces which reflect radiant heat back to the crucible wall, thereby resulting in excessive and non-uniform heating thereof. The weight of sintered aggregates adhering to the crucible wall can deform the wall and further affect the rotational uniform thermal symmetry. Moreover, large amounts of power are required to melt the sintered aggregates, and significant overheating of the crucible occurs and induces additional thermal stresses. Such thermal stresses further contribute to deformation of the crucible and also cause non-uniform dissolution of the crucible into the melt such that particles of the crucible become loosened and suspended in the melt, resulting in reduced zero-defect crystal production yields and throughput. Crucible deformation can cause excessive generation of silicon monoxide, thereby further reducing zero-defect yields. The degree of thermal stress on the crucible generally increases with the size of initial granular polycrystalline silicon loading.

The present invention substantially reduces the melting difficulties which arise when a silicon melt is prepared with a full capacity initial charge of 100% granular polycrystalline silicon. Briefly, in a preferred embodiment, granular polycrystalline silicon is loaded into an empty, unheated crucible and arranged such that, after loading, it does not contact the upper portion of the crucible wall. Chunk polycrystalline silicon is loaded onto the granular polycrystalline silicon. As the crucible is heated, the weight of the chunk polycrystalline silicon exerts a downward force which keeps the granular polycrystalline silicon near the hottest region of the crucible. The chunk polycrystalline silicon also thermally shields the granular polycrystalline silicon from the cooling effects of a purge gas.

Advantageously, a silicon melt may be prepared as described herein with less mechanical and thermal stress on the crucible, thereby minimizing deformation of the crucible, dissolution of the crucible into the melt and generation of silicon monoxide. Moreover, the mixed charge loadings of the present invention overcome the volume limitations associated with initial charges of 100% chunk polycrystalline silicon. Hence, higher capacity silicon melts prepared according to the present invention may be used for producing single crystal silicon ingots with fewer defects at a higher throughput. The present invention is described in further detail below with reference to the figures, in which like items are numbered the same in the several figures.

FIG. 1 illustrates one type of crucible 10 suitable for preparing silicon melts according to the present invention. The crucible 10 should be of a material such as quartz which is compatible with preparing single crystal silicon ingots by the Czochralski method. The crucible 10 has an inner surface 12, an outer surface 14, a centerline 15 and a top edge 16. The inner surface 12 of the crucible 10 may be coated with a devitrification promoter. The inner surface 12 includes a bottom portion 17, a corner portion 18 and a side or wall portion 19, referred to hereinafter as the bottom 17, corner 18 and wall 19, respectively. In the illustrated embodiment, the wall 19 is substantially vertical and the bottom 17 is substantially horizontal. More precisely, the wall 19 defines a substantially vertical circumferential area which includes a top portion 19(a) and a bottom portion 19(b), the top and bottom portions 19(a), 19(b) each including about 50% of the total surface area of the wall 19. The approximate division between the top and bottom portions 19(a), 19(b) is generally illustrated by phantom line 21. The bottom 17 is parabolic, having a slope with a substantially greater horizontal component than vertical component. The corner 18 is a curved annular boundary region in the vicinity of the intersection of the wall 19 and bottom 17. The corner 18 intersects the wall 19 where the curvature of the corner 18 ceases, illustrated generally as line 22. The corner 18 has a radius of curvature which is less than the radius of curvature of the bottom 17 and generally intersects the bottom 17 where the radius of curvature changes. The centerline 15 of the crucible 10 is substantially parallel to the wall 19 and intersects a geometric centerpoint of the bottom 17. While the geometry of the illustrated crucible 10 is preferred, the particular geometry of the crucible 10 may vary from the illustrated embodiment and still fall within the scope of the invention.

In a preferred embodiment, both granular polycrystalline silicon 1 and chunk polycrystalline silicon 2 are loaded into a crucible 10 to prepare a mixed charge. The crucible 10 preferably contains no molten silicon when the polycrystalline silicon 1, 2 is loaded into it. Moreover, the crucible 10 is preferably empty and at ambient temperature prior to loading. However, if the crucible 10 is being recharged after a previous crystal-pulling run, then the crucible 10 may contain some residual molten silicon or some resolidified residual silicon, and may be at an elevated temperature when loaded. The granular polycrystalline silicon 1 preferably contains less than about 600 ppma hydrogen and most preferably less than about 20 ppma hydrogen. Standard chunk polycrystalline silicon 2 may be used.

As shown in FIGS. 2(a) through 2(e), the granular polycrystalline silicon 1 is preferably loaded onto the bottom 17 of the crucible 10. The granular polycrystalline silicon 1 may also cover the corner 18 (FIGS. 2(c) and 3(a)), and the lower portion 19(b) of the walls 19 of the inner surface 12 of the crucible 10 (FIGS. 2(b), 2(d) and 2(e)). To minimize granule-to-wall sintering problems, however, the granular polycrystalline silicon 1 is preferably loaded such that, after loading, none of the granular polycrystalline silicon 1 is in contact with the upper portion 19(a) of the wall 19. Granular polycrystalline silicon 1 contact with the lower portion 19(b) is preferably minimized, but some contact therewith may be necessary to achieve the desired proportion of granular polycrystalline silicon 1 in the mixed charge. The granular polycrystalline silicon 1 may, in an alternative arrangement illustrated in FIG. 2(f), be loaded over a layer of chunk polycrystalline silicon 2 which had been previously loaded over the bottom 17. In such a situation, some of the granular polycrystalline silicon 1 will, due to its small size, fall through the crevices between chunks 2 and also cover a portion of the bottom 17. To maximize the amount of granular polycrystalline silicon 1 loaded relative to chunk polycrystalline silicon 2, and thereby maximize the total mixed charge, the granular polycrystalline silicon 1 is preferably loaded as a mound with the peak of the mound being closer to the centerline 15 than to the wall 19. That is, the granular polycrystalline silicon 1 is preferably loaded to a height at or near the centerline 15 of the crucible 10 which is greater than its height at the wall 19 of the crucible 10. Such mounding maximizes the total charge while minimizing the degree of contact between the granular polycrystalline silicon 1 and the upper portion of the wall 19(a).

The chunk polycrystalline silicon 2 is loaded onto the granular polycrystalline silicon 1, and preferably, completely overlies the granular polycrystalline silicon 1. As discussed in detail below, such a configuration allows the chunk polycrystalline silicon 2 to exert a downward force on the granular polycrystalline silicon 1 and to shield the underlying granular polycrystalline silicon 1 from cooling effects associated with a purge gas. The chunk polycrystalline silicon is preferably loaded such that, after loading, it contacts at least the upper portion 19(a) of the wall 19. Most preferably, chunk polycrystalline silicon 2 rather than granular polycrystalline silicon 1 contacts the both the upper and lower portions 19(a), 19(b) of the wall 19. The chunk polycrystalline silicon 2 should be loaded in a manner which minimizes gouging or scraping of the walls 19 of the inner surface 12.

Figure 2A:
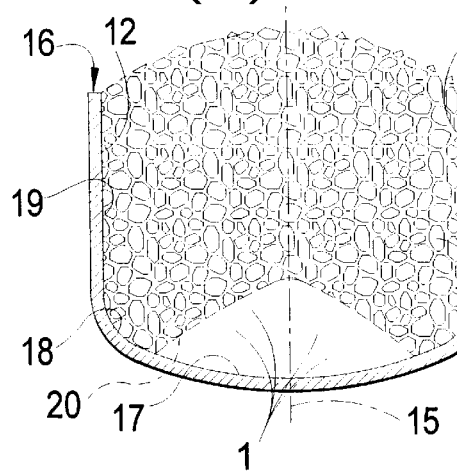
FIGS. 2(a) through 2(f) are section views showing alternative embodiments of a mixed initial charge of granular and chunk polycrystalline silicon.
Figure 2D:
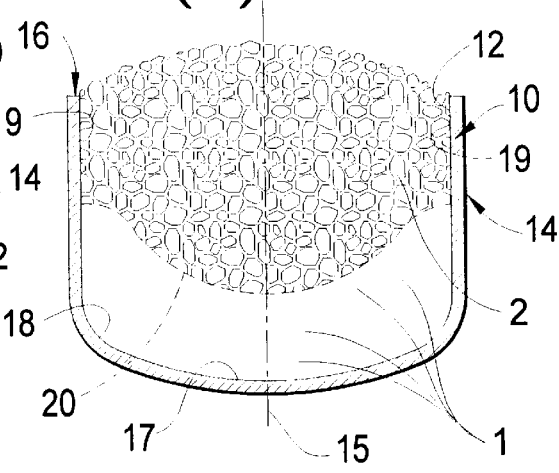
Figure 2B:
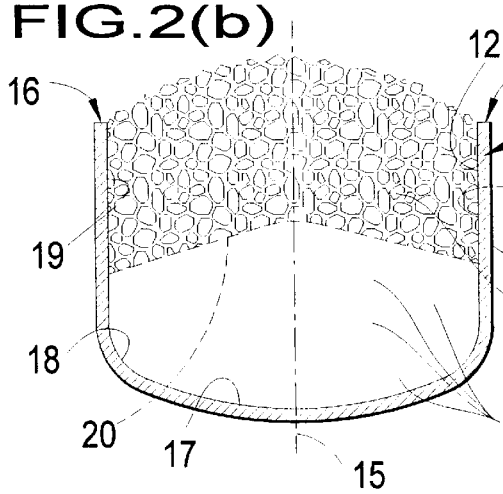
Figure 2E:
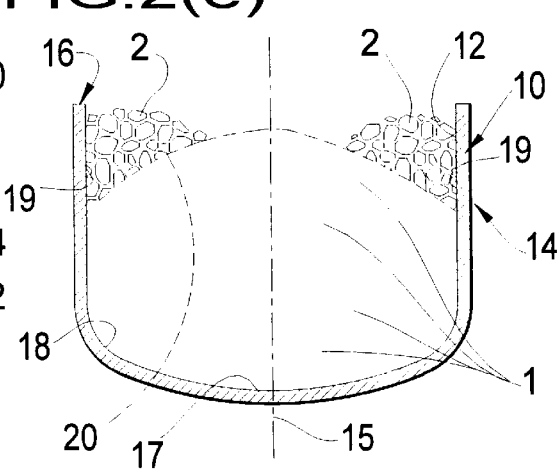
Figure 2C:
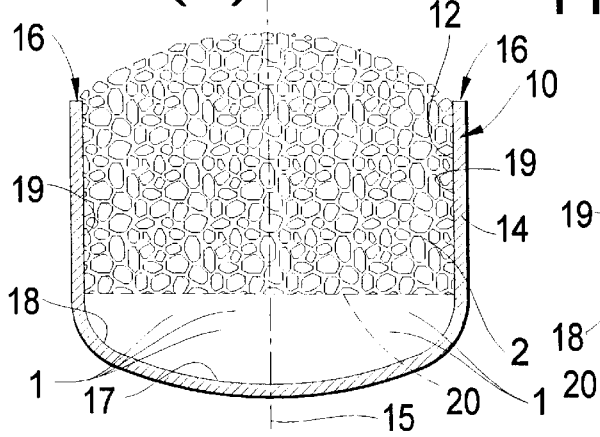
Figure 2F:
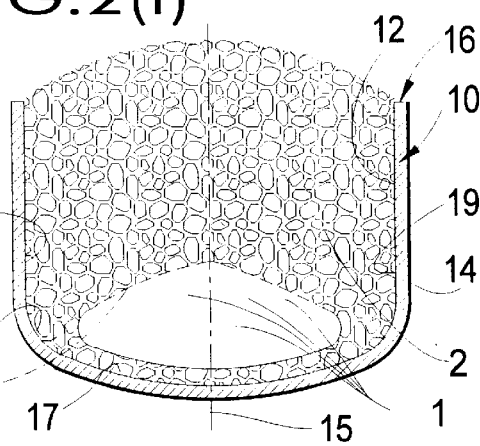

The exact profile of the interface 20 between the granular polycrystalline silicon 1 and the chunk polycrystalline silicon 2 is not narrowly critical. As shown in FIGS. 2(a) through 2(c), the slope of the sides of the mounded pile of granular polycrystalline silicon 1 may vary in steepness, with the maximum slope being defined by the angle of repose for the particular granular polycrystalline silicon 1, typically about 30 degrees. Moreover, the profile of the interface 20 between the granular and chunk polycrystalline silicon 1, 2 may be flat (FIG. 2(c)) or even slightly lower at the centerline 15 of the crucible 10 as compared to near the walls 19 (FIG. 2(d)). It is similarly not narrowly critical that the chunk polycrystalline silicon 2 completely overlie or cover the granular polycrystalline silicon 1. As shown in FIG. 2(e), a portion of the granular polycrystalline silicon 1 may be uncovered.

The amount of granular polycrystalline silicon 1 loaded into the crucible 10 to form a mixed charge preferably ranges from about 5% to about 80% and more preferably from about 10% to about 75% by weight of the total polycrystalline silicon 1, 2 loaded into the crucible 10. The amount of granular polycrystalline silicon 1 most preferably ranges from about 15% to about 50% by weight of the total mixed charge. The preferred proportionate amount of granular polycrystalline silicon 1 in the mixed charge generally increases as crucible size increases, since the change in the size of the bottom 17 of a larger sized crucible 10 as compared to a smaller sized crucible 10, is proportionately larger than the corresponding change in size of crucible walls 19. In a typical 18 inch (45 cm) crucible, for example, the granular polycrystalline silicon 1 loaded preferably comprises from about 15% to about 25% of the total mixed charge loading, whereas in larger sized crucibles, the amount of granular polycrystalline silicon 1 preferably ranges up to about 50%, by weight, of the total mixed charge.

Regardless of the crucible size, the total mixed charge loading is generally greater than the full capacity loading obtainable with 100% chunk polycrystalline silicon 2 for the same size crucible 10. For example, a typical 18 inch (45 cm) crucible can be loaded with a total mixed charge of about 70 kg, which represents a 10 kg (about 17%) increase over the typical 60 kg maximum-capacity loading achieved with 100% chunk polycrystalline silicon. Such higher mixed-charge capacities result from the increased packing density of granular polycrystalline silicon 1, and therefore, the use of higher proportions of granular polycrystalline silicon 1 in the mixed charge generally result in a capacity advantage over loadings of pure chunk polycrystalline silicon 2. However, when very high proportions of granular polycrystalline silicon 1 are used to form the mixed charge, the resulting increased capacity may not translate into increased throughput, due to a higher likelihood of sintering of the granules at such high loadings. The appropriate balance between maximizing capacity by using proportionately more granular polycrystalline silicon 1 and minimizing sintering by using less granular polycrystalline silicon 1 may be determined by persons skilled in the art guided by the ranges presented above.

Once loaded, the crucible 10 is placed in a conventional CZ silicon crystal growth apparatus and the granular and chunk polycrystalline silicon 1, 2 are melted to form a silicon melt 3. The polycrystalline silicon 1 situated near the bottom 17 of the crucible 10 is preferably heated and melted before the chunk polycrystalline silicon 2 situated higher in the crucible 10. As such, a substantial portion of the granular polycrystalline silicon 1 is melted before a substantial portion of the chunk polycrystalline silicon 2 is melted. While the relative proportions may vary based on crucible design, heating profile, and the size and type of crystal grower, about 50% of the granular polycrystalline silicon 1 is preferably melted before about 50% of the chunk polycrystalline silicon 2 is melted, and most preferably before about 25% of the chunk polycrystalline silicon 2 is melted.

Referring to FIGS. 3(a) through 3(c), the crucible 10 is supported by a susceptor 31 which is situated on a movable pedestal 32. The pedestal 32 is positioned such that the bottom of the crucible 10 is near the top of the heater 30 (FIG. 3(a)) and gradually lowered into the space inside the heater 30 (FIGS. 3(b) and 3(c)). The speed at which the crucible 10 is lowered into closer proximity of the heater 30 and the value of other factors affecting melting of the polycrystalline silicon, such as heater power, crucible rotation and system pressure, may be the same as is employed for melting loadings of pure chunk polycrystalline silicon 2. (Example 1). As the granular polycrystalline silicon 1 begins to melt, the weight of the chunk polycrystalline silicon 2 overlying the granular polycrystalline silicon 1 exerts a downward force on any unmelted granular polycrystalline silicon 1. The downward force exerted by the chunk polycrystalline silicon 2 helps to keep the granular polycrystalline silicon 1 away from the crucible walls 19 and near the lower region of the crucible 10. That is, the weight of the chunk polycrystalline silicon 2 helps preclude the unmelted granular polycrystalline silicon 1 from floating away from the lower region of the crucible 10, which is generally relatively hotter due to the heating arrangement described above.

The granular and chunk polycrystalline silicon 1, 2 are typically exposed, while heating, to a purge gas 35 to flush out undesirable gasses such as SiO(g). The purge gas 35 is typically an inert gas such as argon and typically flows at a rate ranging from about 10 l/min to about 300 l/min, depending on the type and size of the crystal puller. In such a situation, the granular and chunk polycrystalline silicon 1, 2 are preferably arranged such that the chunk polycrystalline silicon 2 thermally shields the granular polycrystalline silicon 1 from the cooling effects of the purge gas 35. For example, as shown in FIGS. 3(*a*) and 3(*b*), the chunk polycrystalline silicon 2 overlying the granular polycrystalline silicon 1 acts as such a thermal shield.

As the melting process continues, granule-to-granule and granule-to-wall sintering is minimized by several facets of the present invention. Granule-to-wall sintering is minimized in the upper portion 19(*a*) of the wall 19 by arranging the granular polycrystalline silicon 1 so as not to be in contact therewith. The chunk polycrystalline silicon 2 exerts a downward force on and thermally shields the underlying granular polycrystalline silicon 1, thereby keeping the granular polycrystalline silicon 1 in the hottest region of the crucible 10 and minimizing cooling thereof, respectively. Moreover, heating the crucible 10 from the bottom upwards so as to melt a substantial portion of the granular polycrystalline silicon 1 before melting a substantial portion of the chunk polycrystalline silicon 2 also contributes to minimize sintering. As shown in FIG. 3(*c*), the heating is continued to melt any unmelted granular polycrystalline silicon 1 and chunk polycrystalline silicon 2, thereby forming a silicon melt 3.

In an alternative embodiment, granular polycrystalline silicon 1 is loaded by itself, without chunk polycrystalline silicon 2, into an empty crucible 10 and subsequently melted to form a silicon melt 3 entirely from granular polycrystalline silicon 1. When the polycrystalline silicon used for initial charging of the crucible 10 consists solely of granular polycrystalline silicon 1, however, the amount of granular polycrystalline silicon 1 loaded should be less than about 65% of the maximum weight capacity of the crucible 10, the maximum capacity being based on maximum loadings of pure granular polycrystalline silicon 1. For example, in a typical 18 inch (45 cm) crucible for which the maximum capacity, based on a 100% granular loading is about 70 kg, the amount of granular polycrystalline silicon 1 loaded should be less than about 45 kg. Moreover, the granular polycrystalline silicon 1 should be loaded higher or thicker toward the centerline 15 of the crucible 10 and lower or thinner near the wall 19, as described for the mixed-charge embodiment. Generally, however, the exact shape or profile of such mounded granular polycrystalline silicon 1 is not critical. For example, the profile of the mounded granular polycrystalline silicon 1 could be equivalent to the profiles shown for the interface 20 in FIGS. 2(*a*) through 2(*d*). As shown in these same figures for the mixed-charge embodiment, the granular polycrystalline silicon 1 may cover, in addition to the bottom 17, the corner 18 and the lower portion 19(*b*) of the wall 19 of the inner surface 12 of the crucible 10. The granular polycrystalline silicon 1 preferably is not in contact with the upper portion 19(*a*) of the wall 19. The reduced-capacity loading of 100% granular polycrystalline silicon 1, while generally less desirable than the mixed-charge loadings detailed above, may be important in situations where chunk polycrystalline silicon 2 is not readily available.

The following example illustrates the principles and advantages of the invention.

EXAMPLE 1

A 75 kg mixed charge consisting of 60 kg chunk polycrystalline silicon and 15 kg granular polycrystalline silicon was loaded into an 18 inch (45 cm) quartz crucible according to the preferred embodiment of the present invention, as described above.

After loading, the mixed charge was melted in a Leybold CZ crystal puller. At time zero, the crucible was positioned such that the top edge of the crucible was about 13 cm above the top of the heater and the bottom of the crucible was about 24 cm below the top of the heater. The crucible was then lowered into the space between the heater at an average speed of about 1.2 mm/min. While lowering, the heater power level was step-wise varied as follows: 92 kw for 10 minutes; 115 kw for 30 minutes; and 125 kw for 85 minutes. The lowering continued until the crucible was at a position where the top edge of the crucible was about 2 cm below the top of the heater. The crucible was held at this position for 100 minutes with the power maintained at 112 kw. The crucible was then raised to a position where the top edge of the crucible was 1 cm below the top of the heater and held at this position for 15 minutes with the power at 108 kw. The crucible was then raised to a position where the top edge of the crucible was at the same level as the top of the heater and held at this position at a power level of 100 kw until the polycrystalline silicon became completely molten.

Throughout the melting steps above, the system pressure was 10 mbar (1000 Pa), the crucible was rotated at a speed of 2 rpm, and the polycrystalline silicon was purged with an inert gas at a flow rate of 30 l/min.

EXAMPLE 2

Molten silicon melts prepared from 100% chunk polycrystalline silicon loadings and from mixed charge loadings of the present invention were used to produce single crystal silicon ingots by the Czochralski method. Data was collected to determine the length of zero defect (ZD) single-crystal silicon for each of the silicon melts prepared.

In a first set of ten runs, 60 kg of chunk polycrystalline silicon was loaded into an empty 18 inch (45 cm) CZ crucible and melted according to standard methods known in the art. In a second set of ten runs, a mixed charge comprising 60 kg of chunk polycrystalline silicon and 10 kg of granular polycrystalline silicon was loaded into an empty 18 inch (45 cm) CZ crucible and melted according to the methods of the present invention.

Average values for the length of zero defect single-crystal silicon prepared from the pure chunk and the mixed charge loadings were calculated. The average zero defect length for the mixed charges, normalized to the average value obtained for the pure chunk charges, was 1.21. Hence, the mixed charge loading of the present invention results, on average, in an increase in zero defect length of over 20%.

In light of the detailed description of the invention and the example presented above, it can be appreciated that the several objects of the invention are achieved.

The explanations and illustrations presented herein are intended to acquaint others skilled in the art with the invention, its principles, and its practical application. Those skilled in the art may adapt and apply the invention in its numerous forms, as may be best suited to the requirements of a particular use. Accordingly, the specific embodiments of the present invention as set forth are not intended as being exhaustive or limiting of the invention.

What is claimed:

1. A process for preparing a silicon melt in a crucible for use in growing a single crystal silicon ingot by the Czochralski method, the process comprising
    loading granular polycrystalline silicon into a crucible,
    loading a layer of chunk polycrystalline silicon onto the granular polycrystalline silicon, the layer of chunk polycrystalline silicon comprising from about 20% by weight to about 95% by weight of the total polycrystalline silicon loaded, and
    then heating the loaded crucible to melt the granular polycrystalline silicon and the chunk polycrystalline silicon to form a silicon melt.

2. The process as set forth in claim 1 wherein the layer of chunk polycrystalline silicon loaded onto the granular polycrystalline silicon comprises from about 50% by weight to about 85% by weight of the total polycrystalline silicon loaded.

3. The process as set forth in claim 1 wherein the layer of chunk polycrystalline silicon overlies all of the granular polycrystalline silicon.

4. The process as set forth in claim 1 wherein the crucible has an inner surface which includes a bottom and the granular polycrystalline silicon is loaded onto the bottom.

5. The process as set forth in claim 1 wherein the crucible has an inner surface which includes a wall, the wall having an upper portion which includes about 50% of the surface area of the wall, the loaded granular polycrystalline silicon not contacting the upper portion of the wall.

6. The process as set forth in claim 1 wherein the crucible has a centerline and an inner surface which includes a wall, the granular polycrystalline silicon being loaded to a height at the centerline of the crucible which is greater than its height at the wall.

7. The process as set forth in claim 1 wherein the crucible has a centerline and an inner surface which includes a wall, the wall having an upper portion which includes about 50% of the surface area of the wall, the granular polycrystalline silicon being loaded to a height at the centerline of the crucible which is greater than its height at the wall, a portion of the chunk polycrystalline silicon contacting the upper portion of the wall.

8. The process as set forth in claim 1 wherein the granular polycrystalline silicon and chunk polycrystalline silicon are melted by first melting a substantial portion of the granular polycrystalline silicon before a substantial portion of the chunk polycrystalline silicon is melted, and subsequently melting any remaining unmelted granular and chunk polycrystalline silicon.

9. The process as set forth in claim 1 wherein the granular polycrystalline silicon and chunk polycrystalline silicon are melted by heating the granular and chunk polycrystalline silicon while exposing the granular and chunk polycrystalline silicon to a purge gas, the chunk polycrystalline silicon thermally shielding the granular polycrystalline silicon from cooling effects of the purge gas.

10. The process as set forth in claim 9 wherein the crucible has an inner surface which includes a bottom and the polycrystalline silicon on the bottom is heated first.

11. The process as set forth in claim 1 wherein the amount of granular polycrystalline silicon loaded into the crucible ranges from about 10% to about 80% by weight of the total polycrystalline silicon loaded into the crucible.

12. The process as set forth in claim 1 wherein the granular polycrystalline silicon loaded into the crucible contains less than about 20 ppma hydrogen.

13. The process as set forth in claim 1 wherein the crucible has an inner surface, the inner surface being coated with a devitrification promoter.

14. A process for preparing a silicon melt in a crucible for use in growing a single crystal silicon ingot by the Czochralski method, the process comprising
    loading granular polycrystalline silicon and chunk polycrystalline silicon into a crucible having an inner surface which includes a wall, the wall having an upper portion which includes about 50% of the surface area of the wall, the loaded granular polycrystalline silicon not contacting the upper portion of the wall, and
    melting the granular polycrystalline silicon and the chunk polycrystalline silicon to form a silicon melt.

15. The process as set forth in claim 14 wherein the granular polycrystalline silicon is loaded to a height at the centerline of the crucible which is greater than its height at the wall of the crucible.

16. The process as set forth in claim 14 wherein the chunk polycrystalline silicon is loaded onto the granular polycrystalline silicon.

17. A process for preparing a silicon melt in a crucible for use in growing a single crystal silicon ingot by the Czochralski method, the process comprising
    loading granular polycrystalline silicon and chunk polycrystalline silicon into a crucible, the granular polycrystalline silicon comprising from about 5% by weight to about 80% by weight of the total polycrystalline silicon loaded, and
    melting the granular polycrystalline silicon and the chunk polycrystalline silicon to form a silicon melt, a substantial portion of the granular polycrystalline silicon being melted before a substantial portion of the chunk polycrystalline silicon is melted.

18. The process as set forth in claim 17 wherein the crucible has an inner surface which includes a bottom, the granular polycrystalline silicon covering the bottom.

19. The process as set forth in claim 17 wherein the crucible has a centerline and an inner surface which includes a bottom, the granular polycrystalline silicon being loaded onto the bottom and to a height at the centerline of the crucible which is greater than its height at the wall of the crucible.

20. A process for preparing a silicon melt in a crucible for use in growing a single crystal silicon ingot by the Czochralski method, the process comprising
    loading granular polycrystalline silicon and chunk polycrystalline silicon into a crucible, the chunk polycrystalline silicon being prepared by a Siemens-type process,
    exposing the granular and chunk polycrystalline silicon to a purge gas,
    allowing the chunk polycrystalline silicon to thermally shield the granular polycrystalline silicon from cooling effects of the purge gas, and
    melting the granular and chunk polycrystalline silicon to form a silicon melt.

21. The process as set forth in claim 20 wherein the granular and chunk polycrystalline silicon are heated while being exposed to the purge gas.

22. A process for preparing a silicon melt in a crucible for use in growing a single crystal silicon ingot by the Czochralski method, the process comprising loading granular polycrystalline silicon and chunk polycrystalline silicon into a crucible having a centerline and an inner surface which includes a bottom and a wall, the wall having an upper portion which includes about 50% of the surface area of the wall, the loaded granular polycrystalline silicon not contacting the upper portion of the wall and having a height at the centerline of the crucible which is greater than its height at the wall, the chunk polycrystalline silicon being loaded onto the granular polycrystalline silicon, heating the polycrystalline silicon to melt a substantial portion of the granular polycrystalline silicon before a substantial portion of the chunk polycrystalline silicon is melted, the granular and chunk polycrystalline silicon being exposed, while heating, to a purge gas, the chunk polycrystalline silicon thermally shielding the granular polycrystalline silicon from cooling effects of the purge gas, and melting any unmelted granular polycrystalline silicon and chunk polycrystalline silicon to form a silicon melt.

23. A process for preparing a silicon melt in a crucible for use in growing a single crystal silicon ingot by the Czochralski method, the process comprising loading an amount of granular polycrystalline silicon into a crucible having a centerline, a maximum weight capacity based on a granular polycrystalline silicon loading, and an inner surface which includes a wall, the wall having an upper portion which includes about 50% of the surface area of the wall, the amount of granular polycrystalline silicon loaded being less than about 65% by weight of the maximum capacity of the crucible, the loaded granular polycrystalline silicon not contacting the upper portion of the wall and having a height at the centerline of the crucible which is greater than its height at the wall, and melting the granular polycrystalline silicon to form a silicon melt.

24. The process as set forth in claim 23 wherein the granular polycrystalline silicon is loaded and melted in the absence of chunk polycrystalline silicon, thereby forming a silicon melt entirely from granular polycrystalline silicon.

25. The process as set forth in claim 23 further comprising loading chunk polycrystalline silicon over the granular polycrystalline silicon.

26. A process for preparing a silicon melt in a crucible for use in growing a single crystal silicon ingot by the Czochralski method, the process comprising loading granular and chunk polycrystalline silicon into a crucible, the crucible having a centerline and an inner surface which includes a wall, the granular polycrystalline silicon being loaded to a height at the centerline of the crucible which is greater than its height at the wall, the chunk polycrystalline silicon being loaded onto the granular polycrystalline silicon, and melting the granular polycrystalline silicon and the chunk polycrystalline silicon to form a silicon melt.

27. The process as set forth in claim 26 wherein the wall has an upper portion which includes about 50% of the surface area of the wall and a portion of the chunk polycrystalline silicon contacts the upper portion of the wall.

28. The process as set forth in claim 26 wherein the inner surface includes a bottom, the granular polycrystalline silicon is loaded onto the bottom, and a substantial portion of the granular polycrystalline silicon is melted before a substantial portion of the chunk polycrystalline silicon is melted.

29. The process as set forth in claim 14 wherein the chunk polycrystalline silicon is loaded onto at least a portion of the granular polycrystalline silicon.

30. The process as set forth in claim 14 wherein the chunk polycrystalline silicon is loaded as a layer which overlies all of the granular polycrystalline silicon.

31. The process as set forth in claim 7 wherein the layer of chunk polycrystalline silicon is an annular layer and a portion of the granular polycrystalline silicon located at the centerline of the crucible is not covered by the chunk polycrystalline silicon.

32. The process as set forth in claim 1 wherein the layer of chunk polycrystalline silicon loaded onto the granular polycrystalline silicon comprises from about 25% by weight to about 90% by weight of the total polycrystalline silicon loaded.

33. The process as set forth in claim 1 wherein the layer of chunk polycrystalline silicon loaded onto the granular polycrystalline silicon comprises from about 75% by weight to about 85% by weight of the total polycrystalline silicon loaded.

34. The process as set forth in claim 1 wherein the chunk polycrystalline silicon is prepared by a Siemens-type process.

* * * * *